United States Patent
Yun et al.

(10) Patent No.: US 10,383,238 B2
(45) Date of Patent: Aug. 13, 2019

(54) DISPLAY DEVICE

(71) Applicant: LG ELECTRONICS INC., Seoul (KR)

(72) Inventors: Hyungkwon Yun, Seoul (KR); Chunsoo Chang, Seoul (KR); Munhwan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/524,570

(22) PCT Filed: Nov. 4, 2015

(86) PCT No.: PCT/KR2015/011808
§ 371 (c)(1),
(2) Date: May 4, 2017

(87) PCT Pub. No.: WO2016/072752
PCT Pub. Date: May 12, 2016

(65) Prior Publication Data
US 2017/0318694 A1 Nov. 2, 2017

(30) Foreign Application Priority Data

Nov. 7, 2014 (KR) .................. 10-2014-0154782

(51) Int. Cl.
*H05K 5/00* (2006.01)
*H04N 5/64* (2006.01)
(Continued)

(52) U.S. Cl.
CPC ............. *H05K 5/0017* (2013.01); *H04N 5/64* (2013.01); *H05K 5/0217* (2013.01); *H05K 5/03* (2013.01);
(Continued)

(58) Field of Classification Search
None
See application file for complete search history.

(56) References Cited

U.S. PATENT DOCUMENTS 5,388,382 A * 2/1995 Brooks .................. A47B 97/04
160/135
7,457,120 B2 * 11/2008 Bae ..................... H05K 7/20963
361/704
(Continued)

FOREIGN PATENT DOCUMENTS

| CN | 1609922 | 4/2005 |
| CN | 1893769 | 1/2007 |

(Continued)

OTHER PUBLICATIONS

International Search Report (with English Translation) and Written Opinion dated Mar. 9, 2016 issued in Application No. PCT/KR2015/011808.

(Continued)

*Primary Examiner* — Xanthia C Cunningham
(74) *Attorney, Agent, or Firm* — Ked & Associates, LLP

(57) ABSTRACT

A display device is disclosed. The display device of this invention includes: a display panel; a plate whose one side is attached to the rear surface of the display panel; a module cover including a forming area that is projected and recessed in at least some part to keep a distance from the plate; and a housing attached to the module cover. According to the present invention, it is possible to minimize heat transfer towards the display panel by including a module cover where a forming area is provided to keep a distance from a plate.

20 Claims, 20 Drawing Sheets

(51) Int. Cl.
  *H05K 5/02*  (2006.01)
  *H05K 5/03*  (2006.01)
  *H05K 7/20*  (2006.01)
(52) U.S. Cl.
  CPC ... *H05K 7/20963* (2013.01); *G09G 2330/045* (2013.01)

(56) References Cited

U.S. PATENT DOCUMENTS

| | | | | |
|---|---|---|---|---|
| 7,457,121 B2* | 11/2008 | Kim | H05K 7/20963 | 313/46 |
| 7,764,332 B2* | 7/2010 | Zhang | G02F 1/133308 | 348/794 |
| 7,944,683 B2* | 5/2011 | Sato | H05K 7/20963 | 349/58 |
| 8,154,668 B2* | 4/2012 | Tsujihara | H04N 5/64 | 348/790 |
| 8,218,325 B2* | 7/2012 | Song | H05K 1/0203 | 361/752 |
| 8,325,471 B2* | 12/2012 | Yokota | H05K 7/20963 | 312/223.1 |
| 8,922,983 B1* | 12/2014 | Owen | G06F 1/1656 | 345/175 |
| 9,081,540 B1* | 7/2015 | Cho | G06F 1/1601 | |
| 9,116,662 B1* | 8/2015 | Song | G06F 1/1601 | |
| 9,123,290 B1* | 9/2015 | Cho | G06F 1/1652 | |
| 9,510,440 B2* | 11/2016 | Nam | H05K 1/028 | |
| 9,736,951 B2* | 8/2017 | Cho | H05K 5/0017 | |
| 9,746,901 B2* | 8/2017 | Sung | G09F 9/301 | |
| 2005/0088097 A1* | 4/2005 | Bae | H05K 7/20963 | 313/587 |
| 2006/0125365 A1* | 6/2006 | Kim | H05K 5/02 | 313/46 |
| 2006/0268511 A1 | 11/2006 | Jeong | | |
| 2008/0079888 A1* | 4/2008 | Park | G02F 1/13452 | 349/149 |
| 2009/0225507 A1 | 9/2009 | Sato | | |
| 2009/0284904 A1* | 11/2009 | Wu | G02F 1/133305 | 361/679.01 |
| 2010/0246111 A1 | 9/2010 | Yokota et al. | | |
| 2011/0141694 A1* | 6/2011 | Kamiguchi | H05K 7/20963 | 361/704 |
| 2012/0091484 A1 | 4/2012 | Lee et al. | | |
| 2012/0162567 A1 | 6/2012 | Shimomichi | | |
| 2012/0281367 A1* | 11/2012 | He | H05K 5/02 | 361/728 |
| 2013/0088820 A1* | 4/2013 | Kuroda | H05K 5/0017 | 361/679.01 |
| 2013/0265505 A1 | 10/2013 | Hirofumi et al. | | |
| 2013/0329162 A1* | 12/2013 | Fujii | H05K 7/14 | 349/58 |
| 2014/0198465 A1* | 7/2014 | Park | H05K 5/0226 | 361/749 |
| 2014/0240906 A1* | 8/2014 | Seo | A47B 81/06 | 361/679.01 |
| 2014/0268584 A1* | 9/2014 | Song | H05K 7/02 | 361/728 |
| 2014/0268602 A1* | 9/2014 | Adamik | F24F 11/30 | 361/758 |
| 2014/0376163 A1* | 12/2014 | Song | H04N 5/64 | 361/679.01 |
| 2015/0009635 A1* | 1/2015 | Kang | G09F 9/301 | 361/749 |
| 2015/0043136 A1* | 2/2015 | Kim | G02F 1/133305 | 361/679.01 |
| 2015/0192952 A1* | 7/2015 | Jung | G06F 1/1601 | 361/747 |
| 2015/0212261 A1* | 7/2015 | Masuda | G02F 1/133308 | 348/794 |
| 2015/0219954 A1 | 8/2015 | Kubo | | |
| 2015/0296641 A1* | 10/2015 | Song | H05K 5/0217 | 361/679.01 |
| 2016/0054512 A1* | 2/2016 | Zhou | G02B 6/0068 | 362/613 |
| 2016/0088743 A1* | 3/2016 | Zhang | G06F 1/1601 | 361/679.01 |
| 2016/0135305 A1* | 5/2016 | Shin | G02F 1/133308 | 361/694 |
| 2016/0219726 A1* | 7/2016 | Saito | H04N 5/64 | |
| 2017/0212301 A1* | 7/2017 | Yokawa | G02B 6/0088 | |

FOREIGN PATENT DOCUMENTS

| | | |
|---|---|---|
| CN | 103489371 | 1/2014 |
| CN | 103810942 | 5/2014 |
| JP | 2006-244847 | 9/2006 |
| JP | 2009-222991 | 10/2009 |
| JP | 2011-145320 | 7/2011 |
| KR | 10-2006-0065237 | 6/2006 |
| KR | 10-2014-0090905 | 7/2014 |
| WO | WO 2014/024740 | 2/2014 |

OTHER PUBLICATIONS

European Search Report dated May 11, 2018 issued in EP Application No. 15856984.8.
Chinese Office Action (with English translation) dated Nov. 2, 2018 issued in CN Application No. 201580060599.0.
Chinese Office Action (with English translation) dated May 23, 2019 issued in CN Application No. 201580060599.0.

\* cited by examiner

FIG. 1
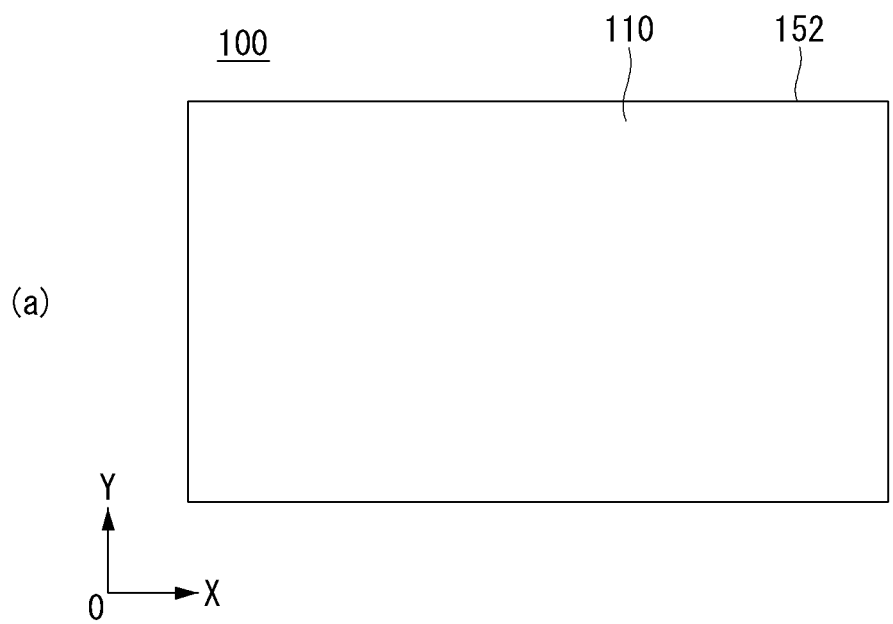
(a)
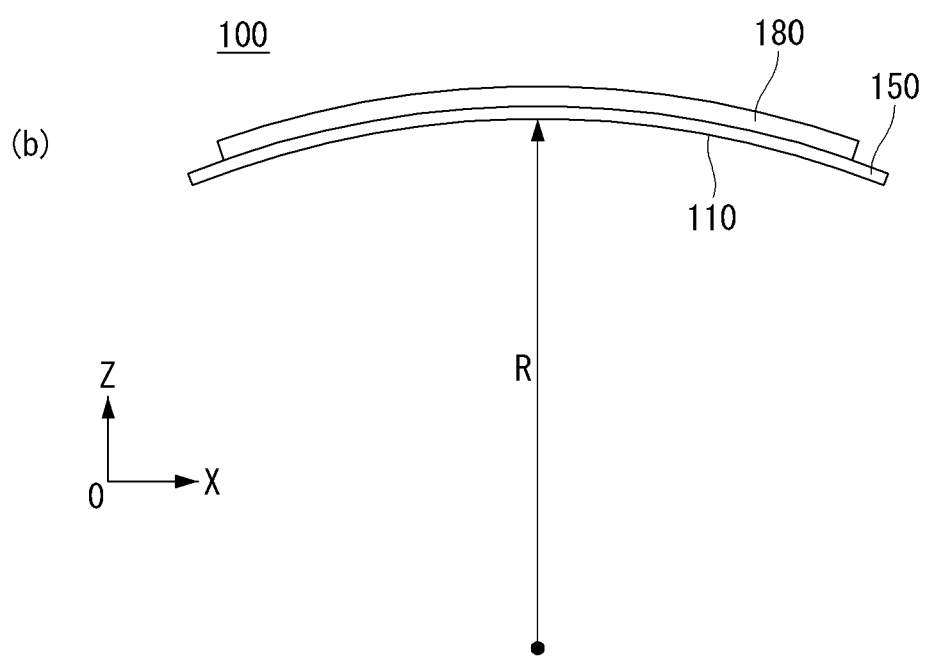
(b)

FIG. 3
(a)
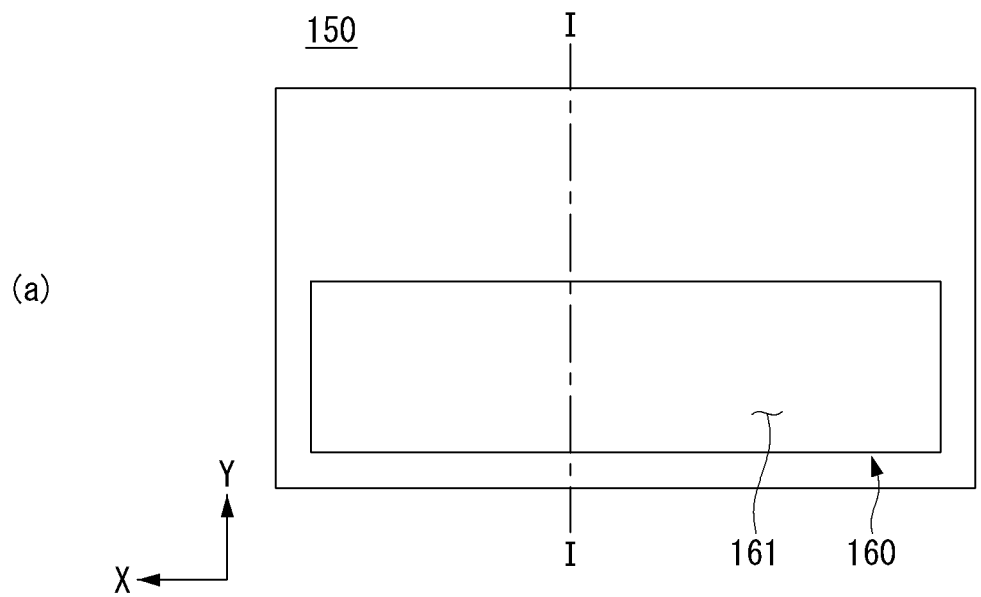
(b)
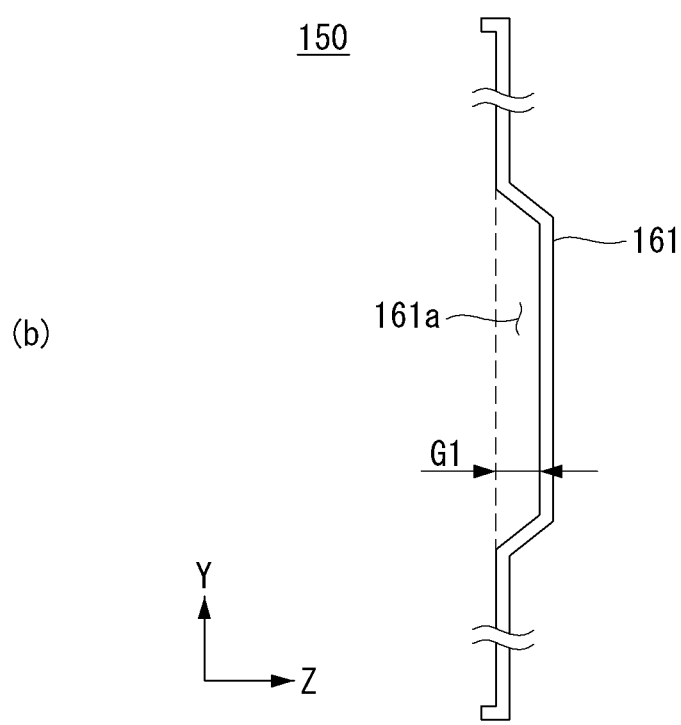

FIG. 4
(a)
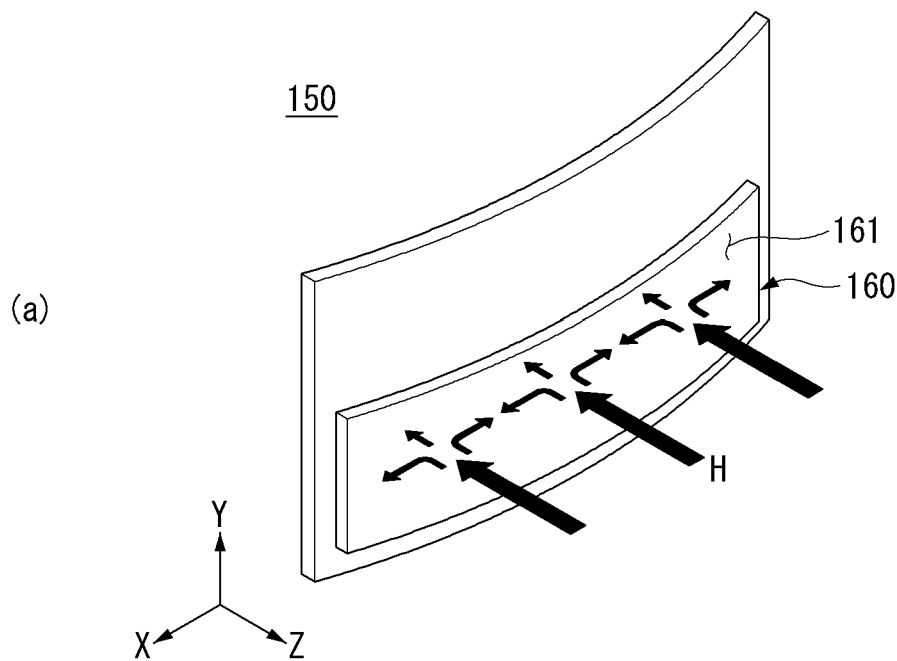
(b)
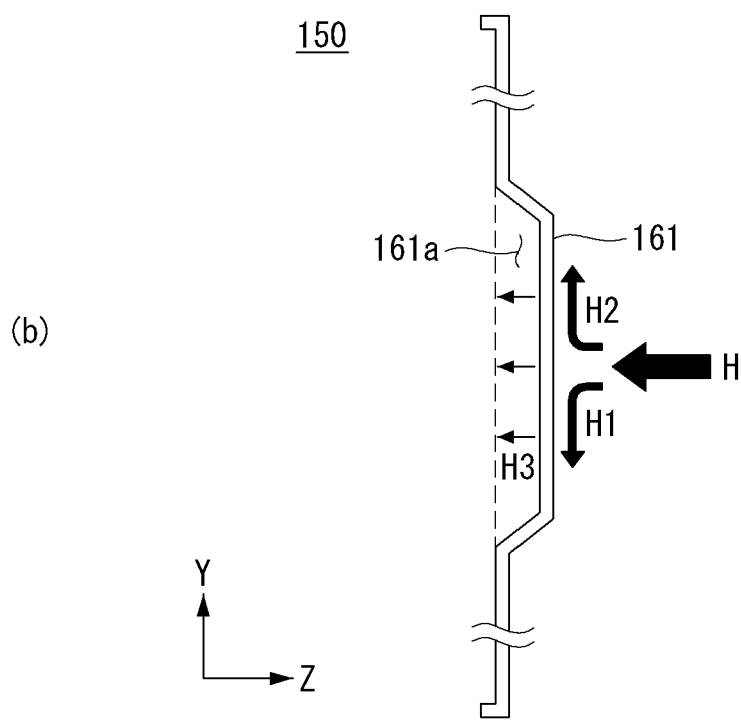

FIG. 5
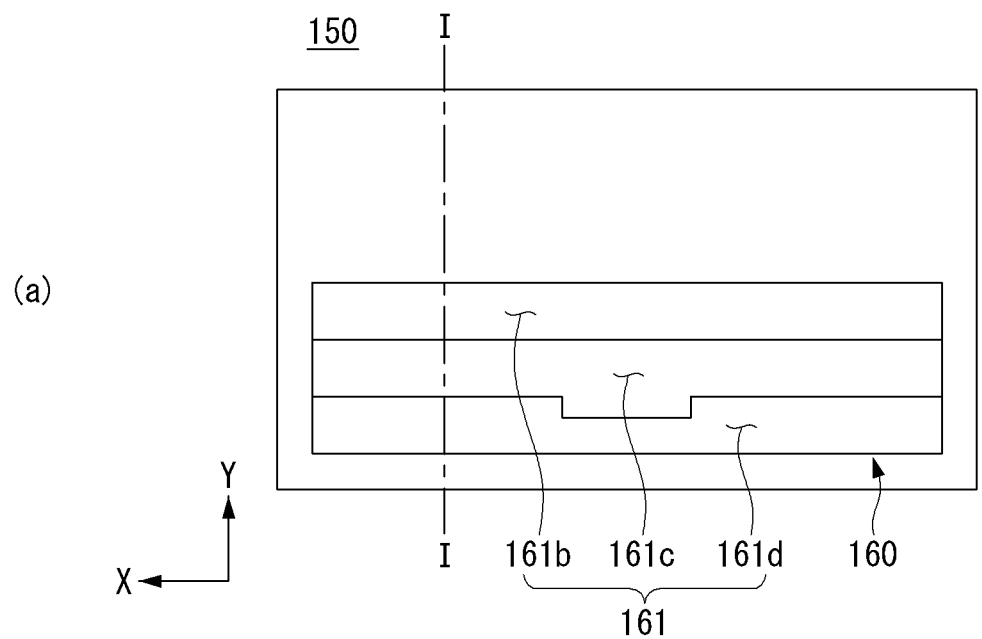
(a)
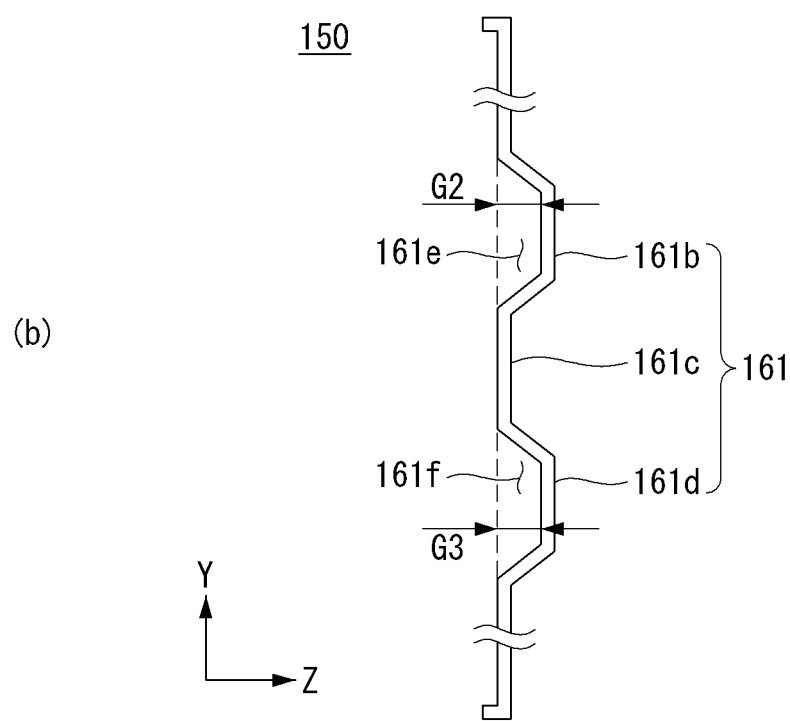
(b)

FIG. 6
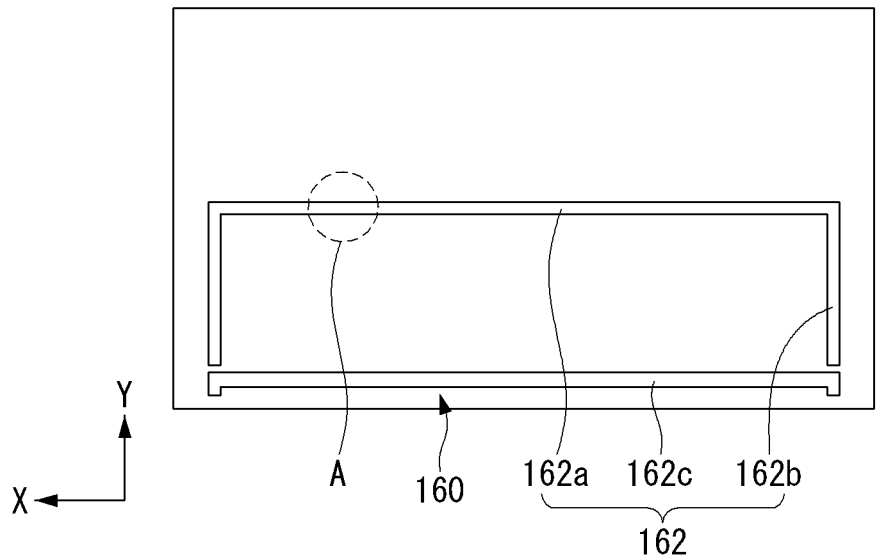
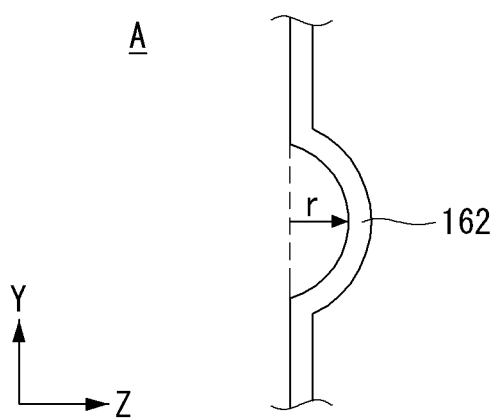

FIG. 7
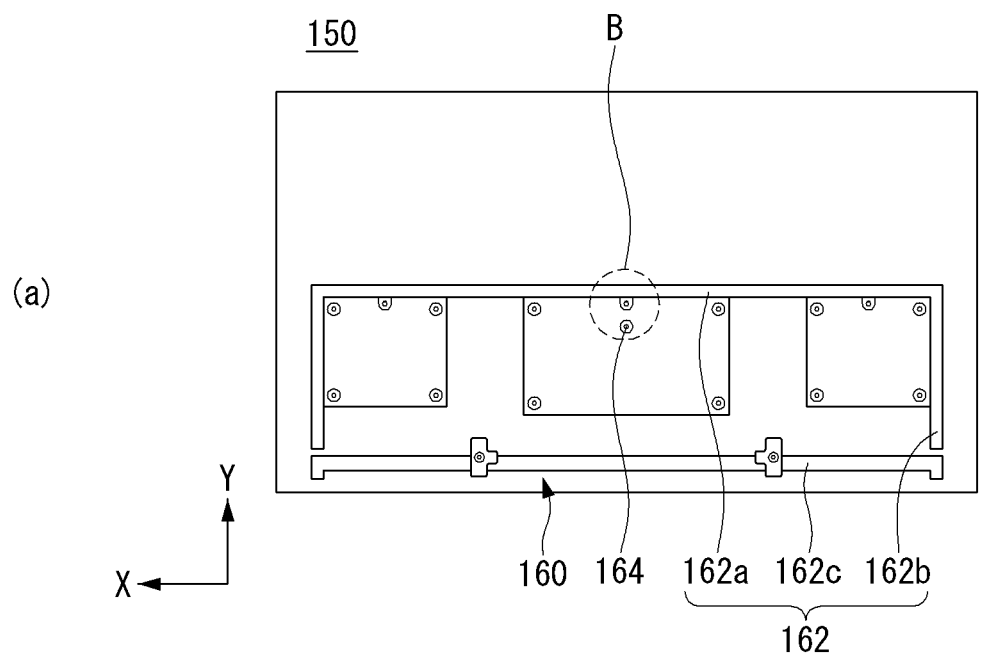
(a)
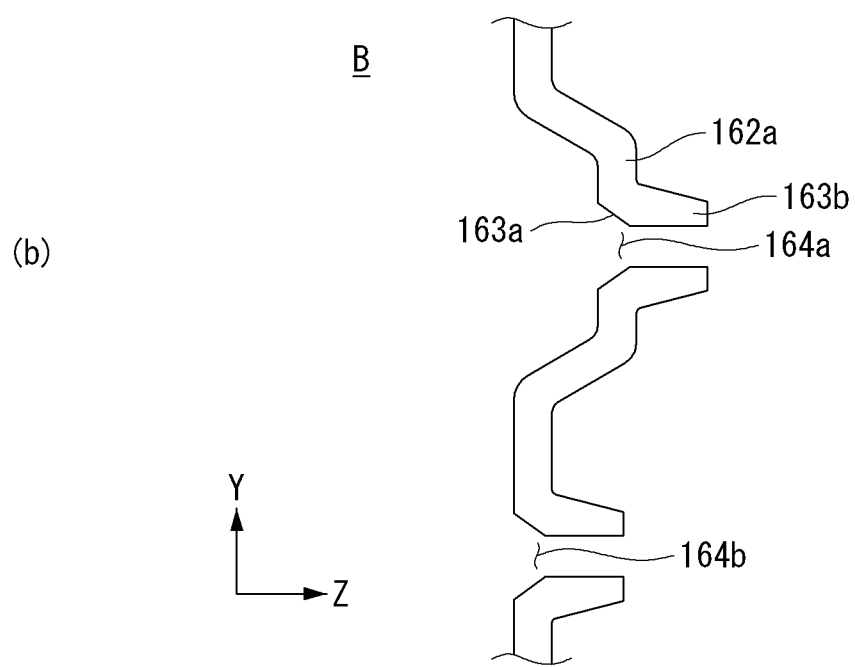
(b)

FIG. 9
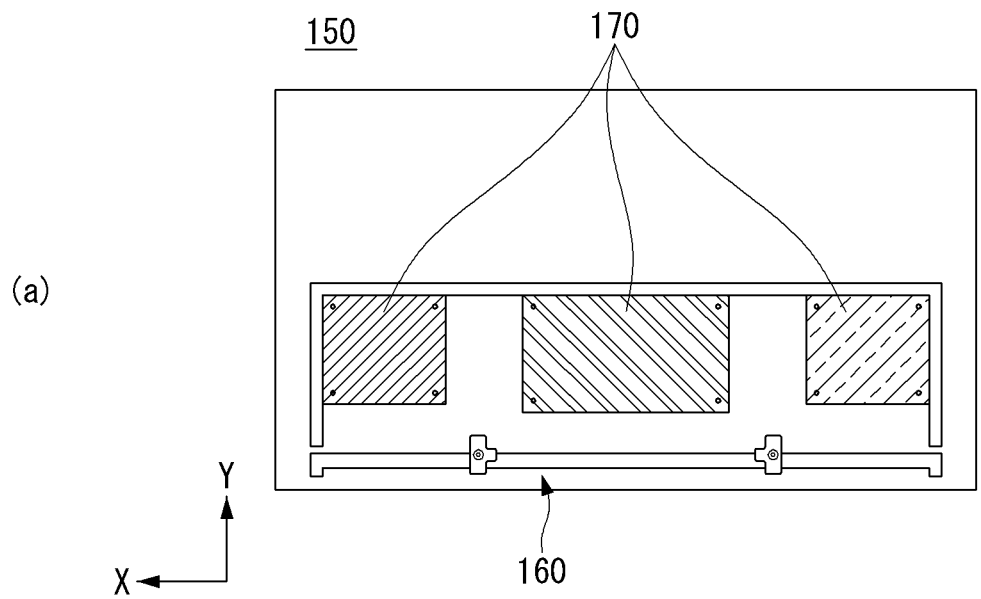
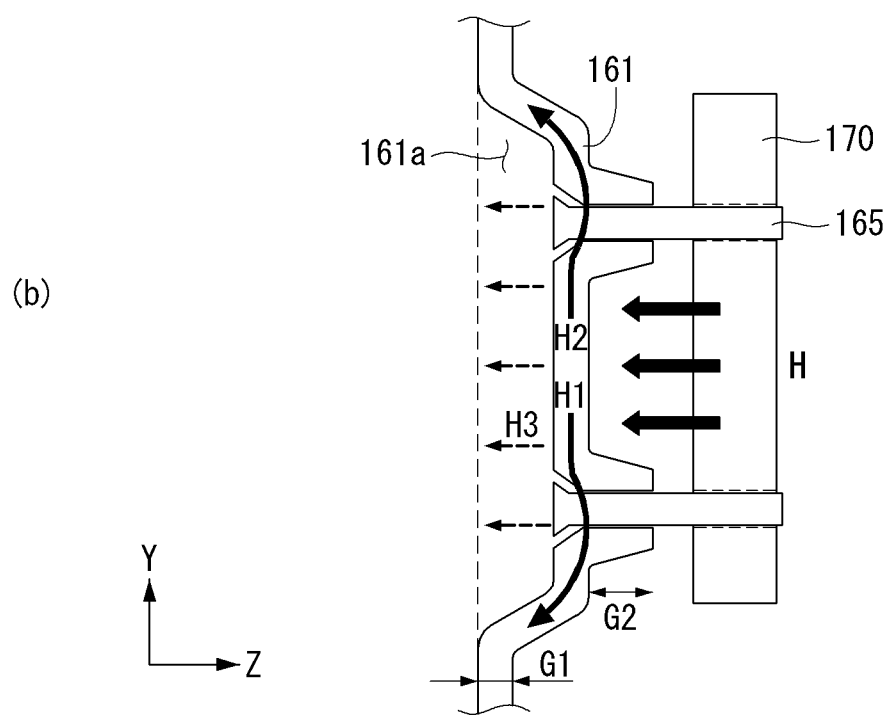

FIG. 12
(a) 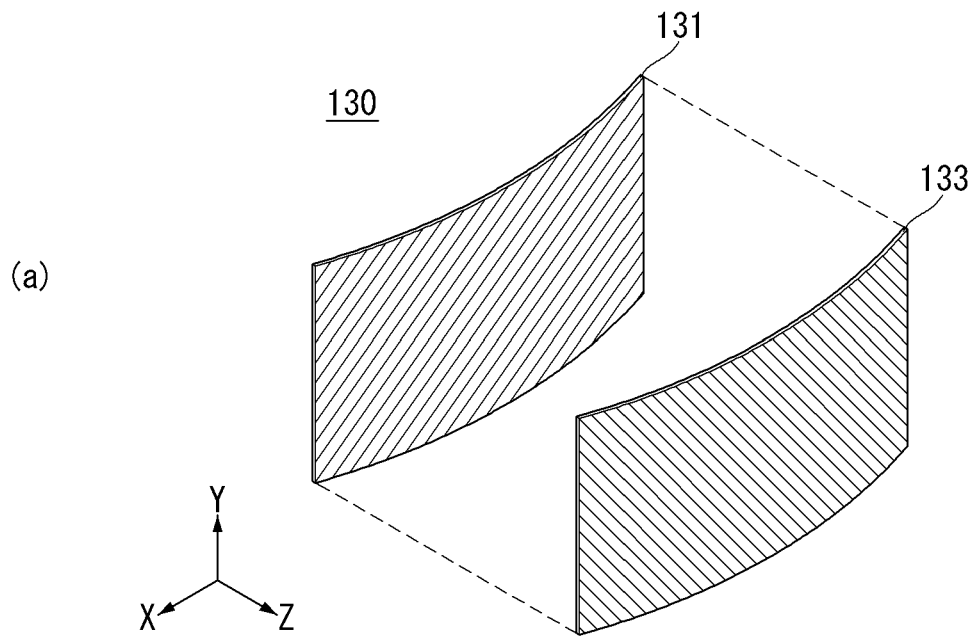
(b) 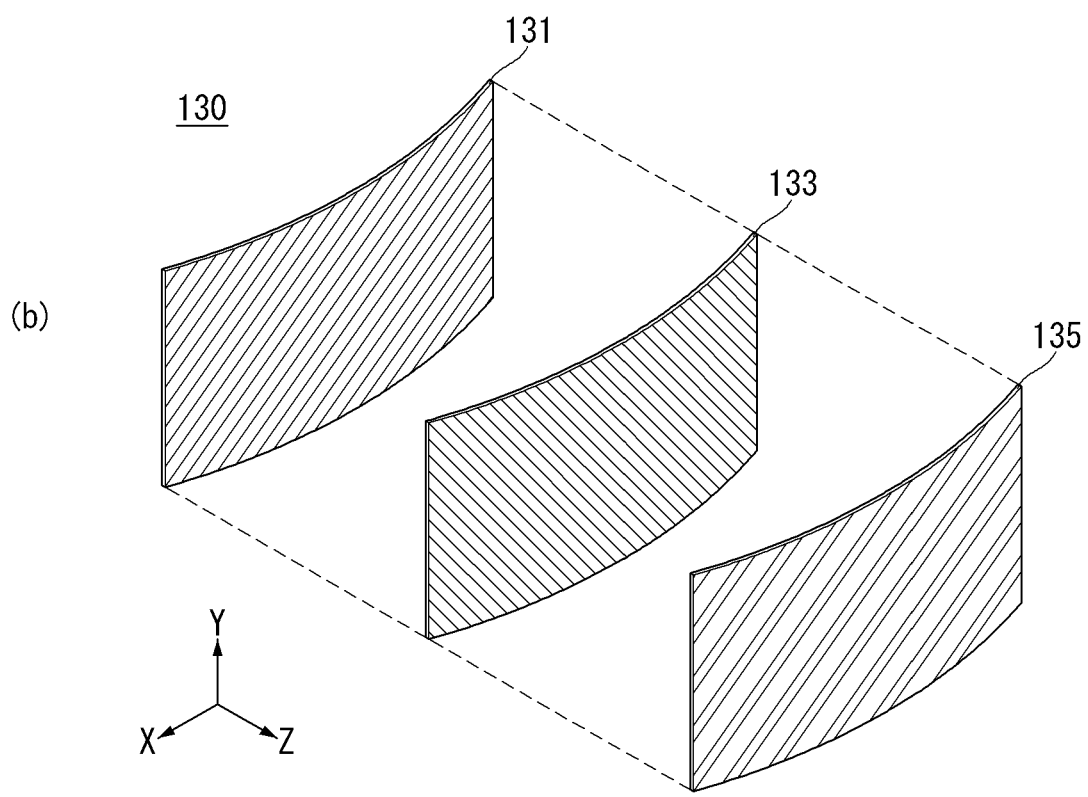

FIG. 14
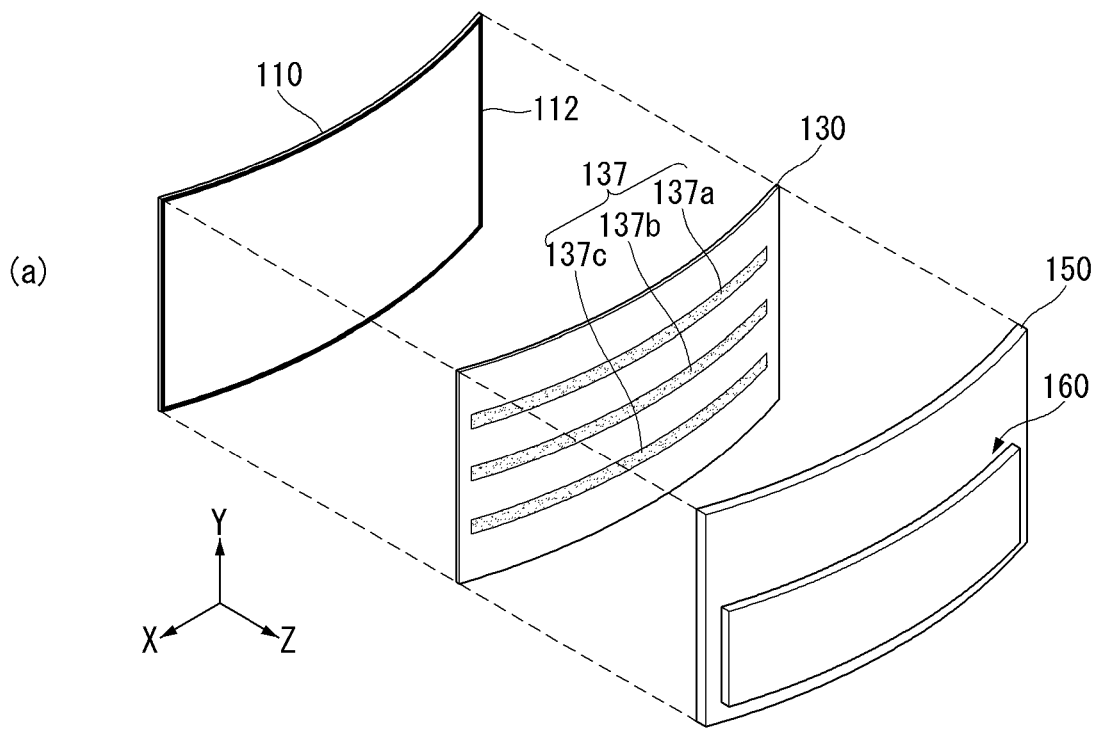
(a)
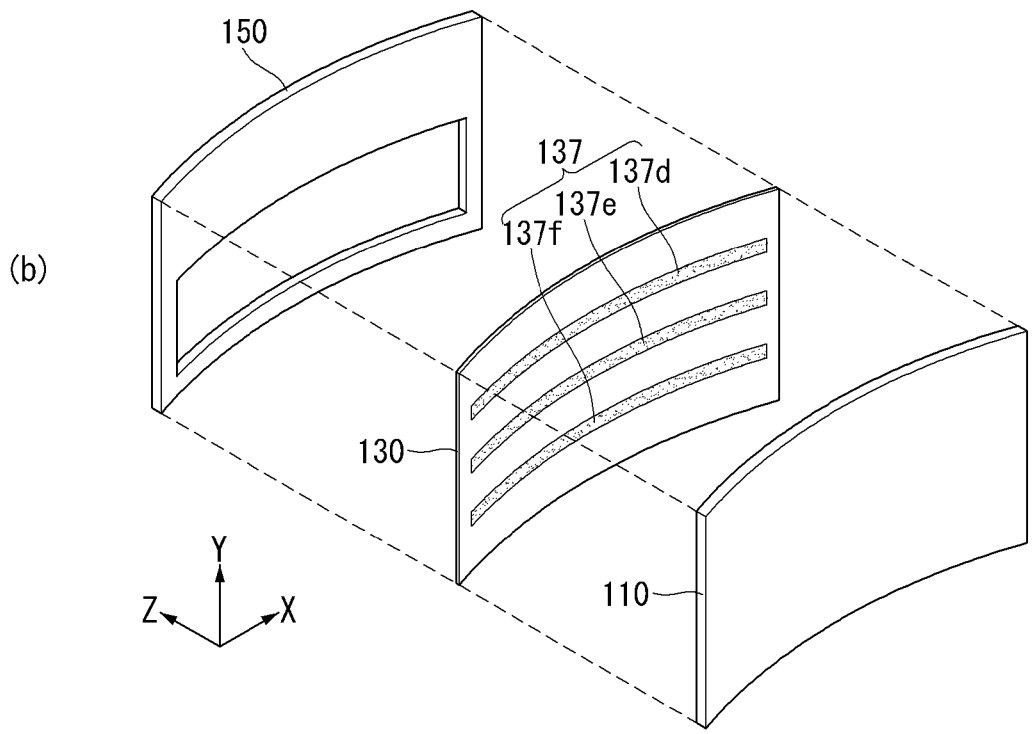
(b)

FIG. 15
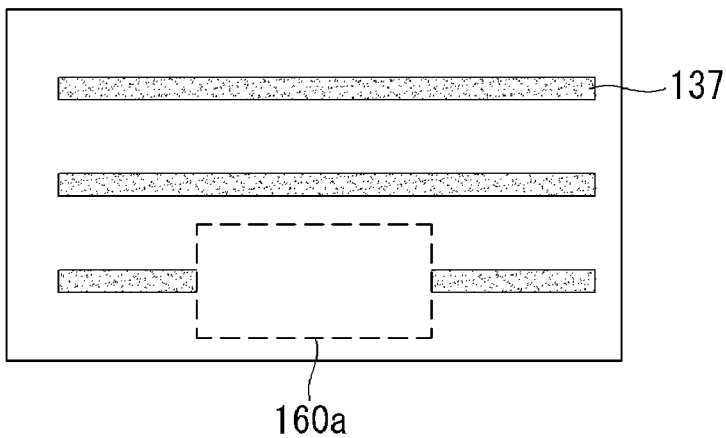
(a)
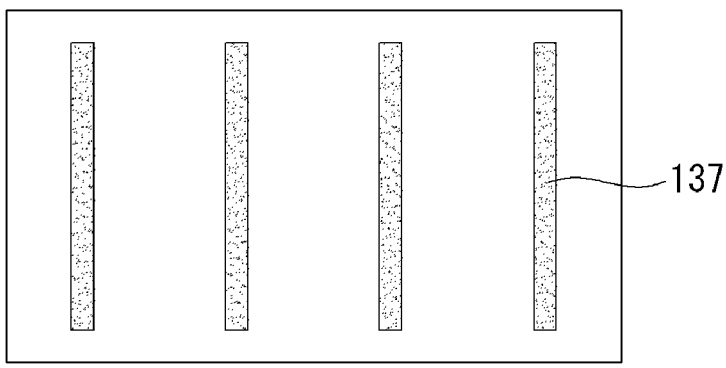
(b)
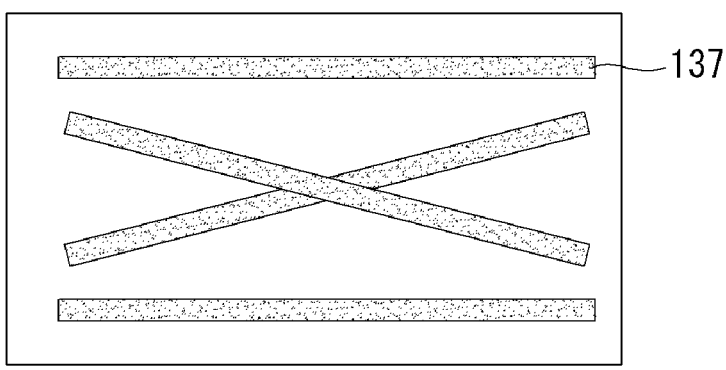
(c)

FIG. 19
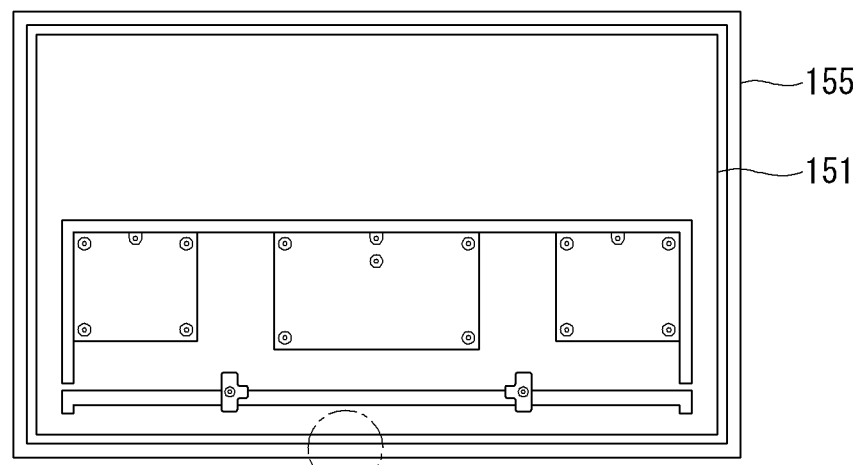
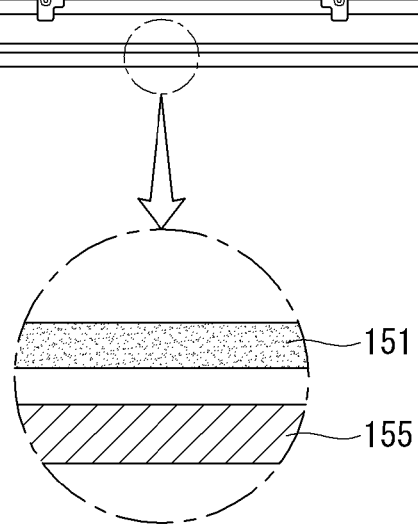

DISPLAY DEVICE

CROSS-REFERENCE TO RELATED PATENT APPLICATIONS

This application is a U.S. National Stage Application under 35 U.S.C. P71 of PCT Application No. PCT/KR2015/011808, filed Nov. 4, 2015, which claims priority to Korean Patent Application No. 10-2014-0154782, filed Nov. 7, 2014, whose entire disclosures are hereby incorporated by reference.

TECHNICAL FIELD

The present invention relates to a display device that is capable of minimizing heat transfer towards a display panel by including a module cover where a forming area is provided to keep a distance from a plate.

BACKGROUND ART

With the development of the information society, various demands for display devices for displaying images are on the rise. In line with this, a variety of display devices have been recently developed and used, including LCDs (liquid crystal displays), PDPs (plasma display panels), ELDs (electroluminescent displays), VFDs (vacuum fluorescent displays), etc.

Among these display devices, those using organic light-emitting diodes (OLED) offer superior luminance and viewing angles compared to LCDs and can be made extremely thin because they work without a backlight unit.

DISCLOSURE

Technical Problem

An aspect of the present invention is to solve the above-mentioned problem and other problems. Another aspect of the present invention is to provide a display device that is capable of minimizing heat transfer towards a display panel by including a module cover where a forming area is provided to keep a distance from a plate.

Technical Solution

To accomplish the above-mentioned or other aspects, an exemplary embodiment of the present invention provides a display device including: a display panel; a plate whose one side is attached to the rear surface of the display panel; a module cover including a forming area that is projected and recessed in at least some part to keep a distance from the plate; and a housing attached to the module cover.

The forming area may include at least one protruding portion that protrudes towards the housing and does not come into contact with the plate.

The protruding portion may be divided into a plurality of regions that protrude at least either in different directions or by different distances.

The width of the forming area may correspond to the width of the housing.

The forming area may further include a rigidity reinforcement bar that is formed continuously in at least one between horizontal and vertical directions of the module cover.

The forming area may include at least one connecting hole that is punctured through the module cover.

The display device may further include fastening members that are fastened to the connecting hole and connect at least one electronic component for driving the display panel to the module cover, wherein at least one of the fastening members may differ in length from at least one of the others.

The module cover may be made of conductive material.

The plate may have a size involving an area corresponding to the forming area.

The plate may further include first adhesive tape that is provided on at least one between the one side and the other side and that adheres to at least one between the display panel and the module cover, wherein at least one strip of the first adhesive tape may be disposed horizontally with respect to the plate.

The first adhesive tape may be disposed in areas other than the area corresponding to the forming area.

The plate may include a first layer of conductive material and a second layer of non-conductive material.

The plate may further include second adhesive tape that connects the display panel and the module cover together.

The module cover may further include a side surface portion that extends towards the display panel, wherein the tip end of the side surface portion may protrude forward than the plane of the display panel.

The display panel may be in the shape of a curved surface that is curved with at least one radius of curvature.

The housing may contain at least one electronic component for driving the display panel.

Advantageous Effects

The effects of a display device according to the present invention will be described below.

According to at least one of the embodiments of the present invention, heat transfer towards a display panel can be minimized by including a module cover where a forming area is provided to keep a distance from a plate.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from the detailed descriptions.

DESCRIPTION OF DRAWINGS

FIG. 1 is a view of a display device according to an embodiment of the present invention.

FIGS. 3 through 10 are views related to a module cover of the display device of FIG. 1.

FIGS. 11 through 16 are views related to a plate of the display device of FIG. 1.

FIGS. 19 and 20 are views related to the module cover of the display device of FIG. 1.

MODE FOR INVENTION

Figure 2:
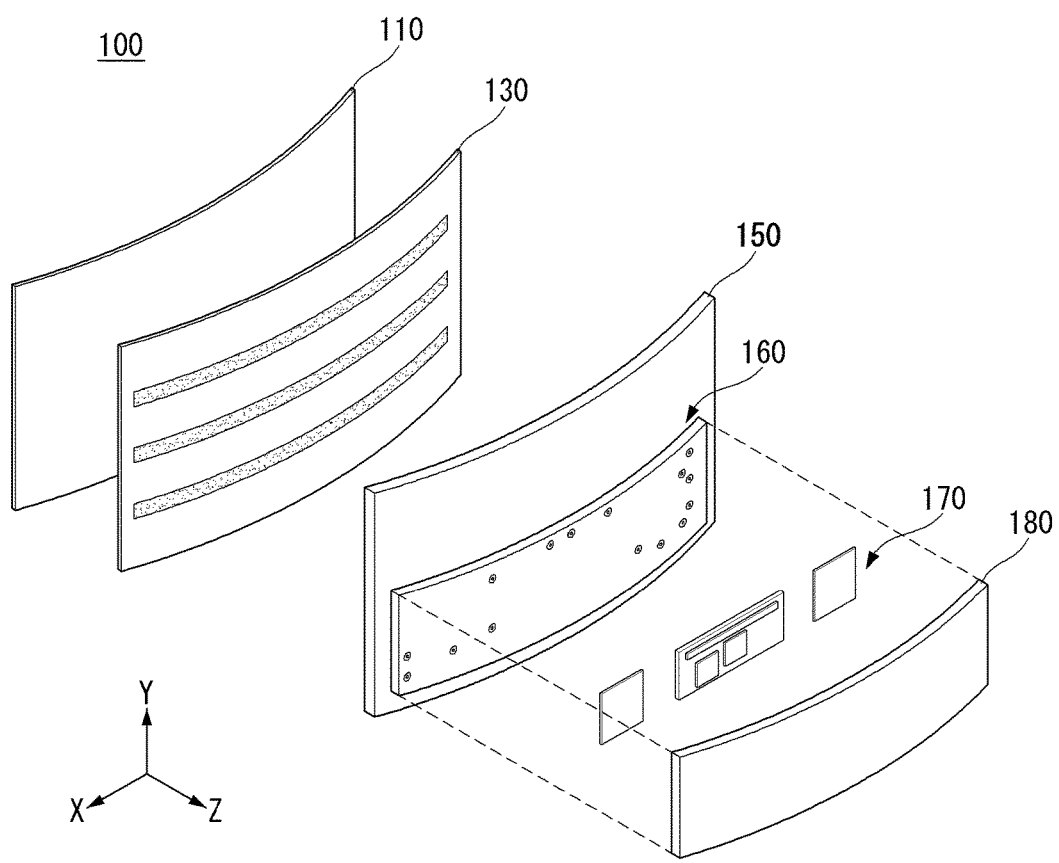
FIG. 2 is an exploded view of the display device of FIG. 1.

Hereinafter, embodiments of the present invention will be described in detail with reference to the accompanying drawings, and the same or similar elements are assigned the same reference numerals regardless of their reference numerals, and a redundant description thereof is omitted. In the following description, the suffixes "module" and "part" for components used in the description below are assigned or mixed in consideration of easiness in writing the specification and do not have distinctive meanings or roles by themselves. Furthermore, in describing the present invention, a detailed description of the known functions and constructions will be omitted if it is deemed to make the gist of the present invention unnecessarily vague. In addition, it is to be understood that the accompanying drawings are only for better understanding of embodiments disclosed in the specification, and does not limit the technical idea disclosed in the specification, and includes all changes, equivalents, and substitutes included in the idea and technical scope of the present invention.

It will be understood that the terms "first" and "second" are used herein to describe various elements but these elements should not be limited by these terms.

These terms are used only to distinguish one element from other elements.

When one element is described as being "connected" or "coupled" to the other element, it should be understood that one element may be directly connected or coupled to the other element, but a third element may be interposed between the two elements. In contrast, when one element is described as being "directly connected" or "directly coupled" to the other element, it should be understood that a third element is not interposed between the two elements.

An expression of the singular number used in this specification includes an expression of the plural number unless clearly defined otherwise in the context.

In this application, terms, such as "comprise", "include", and "have" should not be construed as essentially including all several elements or several steps described in the specification, but the terms may be construed as not including some of the elements or steps or as including additional element or steps. It will be further understood that the terms "comprise", "include", and "have" when used herein, specify the presence of stated features, numbers, steps, operations, elements, parts and/or combinations thereof, but do not preclude the presence or addition of one or more other features, numbers, steps, operations, elements, parts, and/or combinations thereof.

Display devices to be described in this specification may include TVs, mobile phones, smartphones, laptop computers, digital broadcasting terminals, PDAs (personal digital assistants), PMPs (portable multimedia players), navigation systems, slate PCs, tablet PCs, ultrabooks, wearable devices (e.g., smartwatches, smart glasses, and HMDs (head-mounted displays), etc.

FIG. 1 is a view of a display device according to an embodiment of the present invention.

As shown in this figure, a display device 100 according to an embodiment of the present invention may be configured to have a curvature.

As shown in (a) of FIG. 1, the display device 100 may be rectangular when viewed from the front. When viewed from the front, the front surface of a display panel 110 constituting the display device 100 may be observed.

A bezel 152 may be shaped to surround the outside of the display panel 110.

The bezel 152 may be part of a module cover. By the way, the bezel 152 may not be observable when the display device 100 is observed from the front.

As shown in (b) of FIG. 1, when viewed from above, the display device 100 may have a curvature R. For example, this means that a housing 180 containing the display panel 110, module cover 150, and/or PCB substrate may be configured to have a certain curvature. With the display device 100 having a certain curvature, a user viewing the display device 100 becomes more immersed in the content they're watching.

FIG. 2 is an exploded view of the display device of FIG. 1.

As shown in this figure, the display device 100 according to an embodiment of the present invention may include a display panel 110, a plate 130, a module cover 150, and a housing 180.

The display panel 110 may be a part that actually displays an image.

The display panel 110 may include a plurality of layers; for example, a front substrate, a back substrate, and/or an optical layer.

The display panel 110 may be an organic light-emitting diode (OLED) panel that emits light by itself. The OLED panel may not require lighting for displaying images. Thus, it may be made relatively thin and curved to a certain curvature.

The plate 130 may be attached to the rear surface of the display panel 110. The plate 130 and the display panel 110 may be connected together with adhesive tape, etc. The plate 130 may be made of aluminum material. Although will be described in detail in the relevant sections, the plate 130 made of aluminum material may distribute the heat transferred to the display panel 110. This prevents heat from being concentrated in a particular area of the display panel 110, thereby avoiding deformation of the display panel 110.

The module cover 150 may be attached to the plate 130. The module cover 150 and the plate 130 may be connected together with adhesive tape, etc. Thus, the display panel 110 may be attached to one side of the plate 130, and the module cover 150 may be attached to the other side. A forming area 160 may be provided in the module cover 150.

The forming area 160 may refer to an area which is processed such that some part of the module cover 160 is on a different level from other parts. For example, this means that the forming area 160 may be projected and recessed by press work. Although will be described in detail in the relevant sections, the forming area 160 may reduce the heat transferred directly to the display panel 110.

The housing 180 may be connected to the module cover 150. The housing 180 may be connected to the forming area 160 of the module cover 150. That is, this means that the size of the forming area 160 may correspond to the size of the housing 180.

The housing 180 may contain various electronic components 170. For example, this means that it may contain control parts, power supply parts, etc. for driving the display panel 110. The electronic components 170 may generate heat during operation.

The heat generated from the electronic components 170 may be transferred to the display panel 110 through the module cover 150, etc. The display device 100 according to an embodiment of the present invention may prevent the heat generated from the electronic components 170 within the housing 180 from being concentrated in a particular area of the display panel 110.

FIGS. 3 to 10 are views related to the module cover of the display device of FIG. 1. As shown in these figures, the display device 100 according to an embodiment of the present invention may include a module cover 150 including a forming area 160. As shown in (a) of FIG. 3, the forming area 160 may be formed on the back side of the module cover 150. For example, some part of the back side of the module cover 150 may be protruded. The forming area 160 may have an overall rectangular shape. The shape of the forming area 160 may correspond to the housing (180 of FIG. 2) attached to the module cover 150.

As shown in (b) of FIG. 3, in the forming area 160, the module cover 150 may be protruded towards the rear. That is, this means that the forming area 160 may include a protruding portion 161 and a recessed portion 161*a* formed by the protruding portion 161. The recessed portion 161*a* may be a space as large as a distance G1 depending on the degree of processing.

As shown in (a) of FIG. 4, the module cover 150 may receive heat H. For example, this means that it may receive heat generated by the operation of the electronic components (170 of FIG. 2) contained in the housing (180 of FIG. 2). The heat transferred to the module cover 150 may be distributed in the forming area 160. For example, this means that heat H may be conducted along the protruding portion 161 of the forming area 160.

The module cover 150 may be made of material with high thermal conductivity. For example, this means that the module cover 150 may be made of aluminum material. Thus, the heat conducted to the forming area 160 may be quickly conducted throughout the entire area of the module cover 150 and released into the air. Accordingly, the heat H may be prevented from being concentrated at a particular spot.

If heat is conducted along the protruding portion 161, this may prevent the heat from being concentrated at a particular spot. Accordingly, it is possible to avoid the display panel (110 of FIG. 1) being affected by heat concentrated at a particular spot.

As shown in (b) of FIG. 4, the recessed portion 161*a* may be formed by the protruding portion 161. The recessed portion 161 is filled with air, which has lower thermal conductivity than the module cover 150. Thus, the heat transferred to the protruding portion 161 is distributed in the form of first and second heat flows H1 and H2, along the protruding portion 161, which may result in a relative small amount of third heat H3 that passes through the recessed portion 161*a* and is transferred towards the front surface.

As shown in (a) of FIG. 5, the forming area 160 may be divided into a plurality of regions. For example, this means that it may be divided into a plurality of protruding portions 161. The protruding portions 161 may comprise first to third protruding portions 161*b* to 161*d*.

As shown in (b) of FIG. 5, the plurality of protruding portions 161 may differ in the direction and/or degree of projection and recession. For example, the first and third protruding portions 161*b* and 161*d* may protrude in the Z direction, and the second protruding portion 161*c* may protrude in the −Z direction.

First and second recessed portions 161*e* and 161*f* may be formed depending on the direction and/or degree of protrusion of the plurality of protruding portions 161. That is, this means that the plurality of recessed portions 161*e* and 161*f* may be discontinuous.

The first recessed portion 161*e* may be at a second distance G2, and the second recessed portion 161*f* may be at a third distance G3. The second and third distances G2 and G3 may be equal or different. For example, in a case where an electronic component corresponding in position to the first protruding portion 161*b* generates more heat than an electronic component corresponding in position to the third protruding portion 161*d*, the second distance G2 may be set longer than the third distance G3. If the second distance G2 is longer than the third distance G3, the heat generated from the electronic component corresponding in position to the first protruding portion 161*b* can be more effectively prevented from being transferred to the display panel.

As shown in (a) of FIG. 6, the forming area 160 may have rigid bars 162. For example, this means that some parts of the module cover 150 may be processed into the shape of bars protruding in one direction. The rigid bars 162 may comprise horizontal rigid bars 162*a* and 162*c* for horizontal rigidity reinforcement and/or vertical rigid bars 162*b* for vertical rigidity reinforcement.

The module cover 150 may be made of material with high thermal conductivity; for example, an aluminum-containing material. Aluminum materials have high thermal conductivity but their rigidity may be relatively weak when processed into the shape of a flat panel. Moreover, the thickness of the module cover 150 may be limited. That is, there might be situations in which it is difficult to ensure the thickness is sufficient to reinforce the rigidity of the module cover 150 because of design limitations on the overall thickness of the display device 100. The rigid bars 162 may be formed in order to reinforce the lack of rigidity due to the material characteristics and/or design limitations mentioned above.

The rigid bars 162 may form a rectangular shape corresponding to the overall shape of the forming area 160. The rigid bars 162 forming a rectangular shape may be connected as one or separated at some parts. For example, the second horizontal rigid bar 162*c* may be separated from the first horizontal rigid bar 162*a* and/or the vertical rigid bars 162*b*.

As shown in (b) of FIG. 6, the rigid bars 162 may form a semicircular shape with a radius r of rotation. That is, this means that a semicircular projection may be formed in a horizontal direction and/or vertical direction.

As shown in (a) of FIG. 7, a plurality of connecting holes 164 may be formed in the forming area 160. The plurality of connecting holes 164 may be used for fastening the electronic components (170 of FIG. 2) and/or the housing (180 of FIG. 2). That is, this means that fastening members (165*a* of FIG. 8) are inserted into the connecting holes 164 formed in the module cover 150 so that the electronic components (170 of FIG. 2) and/or the housing (180 of FIG. 2) are connected to the module cover 150. The connecting holes 164 may be formed where necessary in the forming area 160 and/or the module cover 150.

As shown in (b) of FIG. 7, the connecting holes 164*a* and 164*b* may be punctured through the module cover 150. To increase strength, the connecting holes 164*a* and 164*b* may undergo some processing. For example, this means that a tapered region 163*a* and a protruding region 163*b* may be formed respectively at the entrance and exit of each of the connecting holes 164*a* and 164*b*. The fastening members (165*a* of FIG. 8) may be stably coupled to the connecting holes 164*a* and 164*b* by means of the tapered region 163*a* and the protruding region 163*b*.

Figure 8:
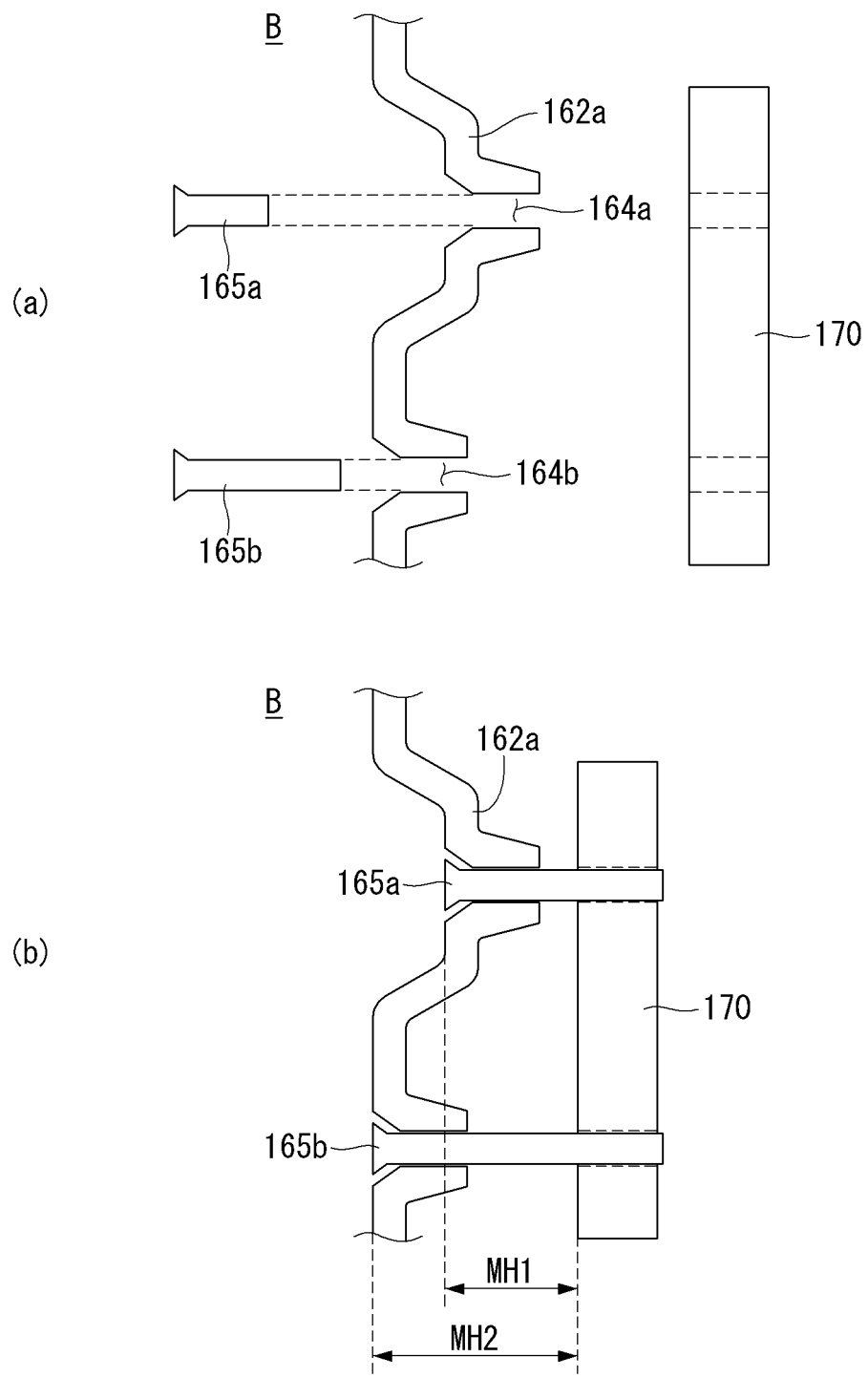

As shown in (a) of FIG. 8, the fastening members 165*a* and 165*b* may be coupled to the connecting holes 164*a* and 164*b*.

As shown in (b) of FIG. 8, the fastening members 165*a* and 165*b* coupled via the connecting holes 164*a* and 164*b* may be attached to an electronic component 170. This is different from the conventional art where a bracket is attached to the module cover 150 and then the electronic component 170 is attached to the bracket. That is, this means that the electronic component 170 can be efficiently connected to the module cover 150 with less processing compared to the conventional art.

The fastening members 165a and 165b may vary in size. For example, this means that a first length MH1, which is the length of the first fastening member 165a, and a second length MH2, which is the length of the second fastening member 165b, may be different. That is, this means that the electronic component 170 can be connected without tilting even at different heights, taking into consideration that there may be a difference in height depending on the positions where the first and second fastening members 165a and 165b are connected.

As described above, the display panel 110 of the display device 100 according to an exemplary embodiment of the present invention has a curvature. Thus, the electronic component 170 may be connected in parallel, regardless of the curvature, by using fastening members of different lengths when connecting them to the inside of the display panel 110 and when connecting them to the outside.

As shown in (a) of FIG. 9, various electronic components 170 may be connected to the forming area 160 of the module cover 150.

As shown in (b) of FIG. 9, the electronic components 170 connected to the module cover 150 may generate heat H during operation. The electronic components 170 and the module cover 150 may be spaced a distance G2 apart because of the fastening members 165. The greater the distance G2 between the module cover 150 and the fastening members 165, the less the effect of the heat H generated during the operation of the electronic components 170. However, the distance G2 between the module cover 150 and the fastening members 165 needs to be minimized because of the design needs for thin display devices 100. The heat H generated from the electronic components 170 may be transferred to the module cover 150.

Part of the heat transferred to the module cover 150 may be conducted along the module cover 150 of conductive material. For example, this means that a flow of first distributed heat H2 is transferred along the surface of the module cover 150. Since part of the heat H generated during the operation of the electronic components 170 is distributed in the form of first distributed heat H2, this may mitigate concentrated heating of a particular area due to the heat H from the electronic components 170.

The module cover 150 may have a protruding portion 161. That is, this means that part of the module cover 150 may protrude rearward than other parts.

A recessed portion 161a may be formed by the protruding portion 161. That is, this means that a space filled with air may be formed as the protruding portion 161 protrudes a distance G1. Second distributed heat H3, part of the heat generated from the electronic components 170, may be transferred in the direction of the recessed portion 161a. However, the recessed portion 161, which is made of non-conductive material and filled with air, as opposed to the module cover 150 made of conductive material, may limit the conduction of the second distributed heat H3 in the direction of the recessed portion 161a. Accordingly, this can minimize the transfer of heat from the electronic components 170 to the display panel (110 of FIG. 2) positioned in the direction of the recessed portion 161a.

Figure 10:
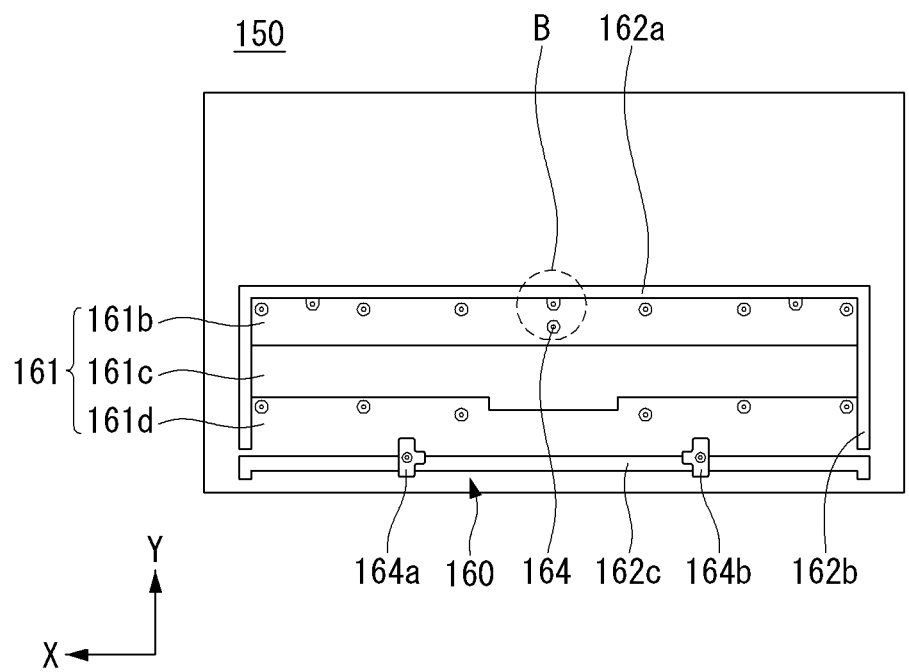

As shown in FIG. 10, the module cover 150 according to an embodiment of the present invention may have all or at least two of the above-described elements. For example, horizontal rigid bars 162a and 162c and/or vertical rigid bars 162b may be formed. The forming area 160 may include first to third protruding portions 161b to 161d. The forming area 160 may include a plurality of connecting holes 164. It may further include stand-fixing supports 164a and 164b. The stand-fixing supports 164a and 164b may be connecting holes via which a stand is connected to the display device 100. The stand-fixing supports 164a and 164b may be provided in an area corresponding to the second horizontal rigid bar 162c to structurally reinforce rigidity.

FIGS. 11 through 16 are views related to a plate of the display device of FIG. 1. As shown in these figures, the display device 100 according to an embodiment of the present invention may further include a plate 130 that is located between the display panel 110 and the module cover 150 and blocks heat transfer towards the display panel 110.

Figure 11:
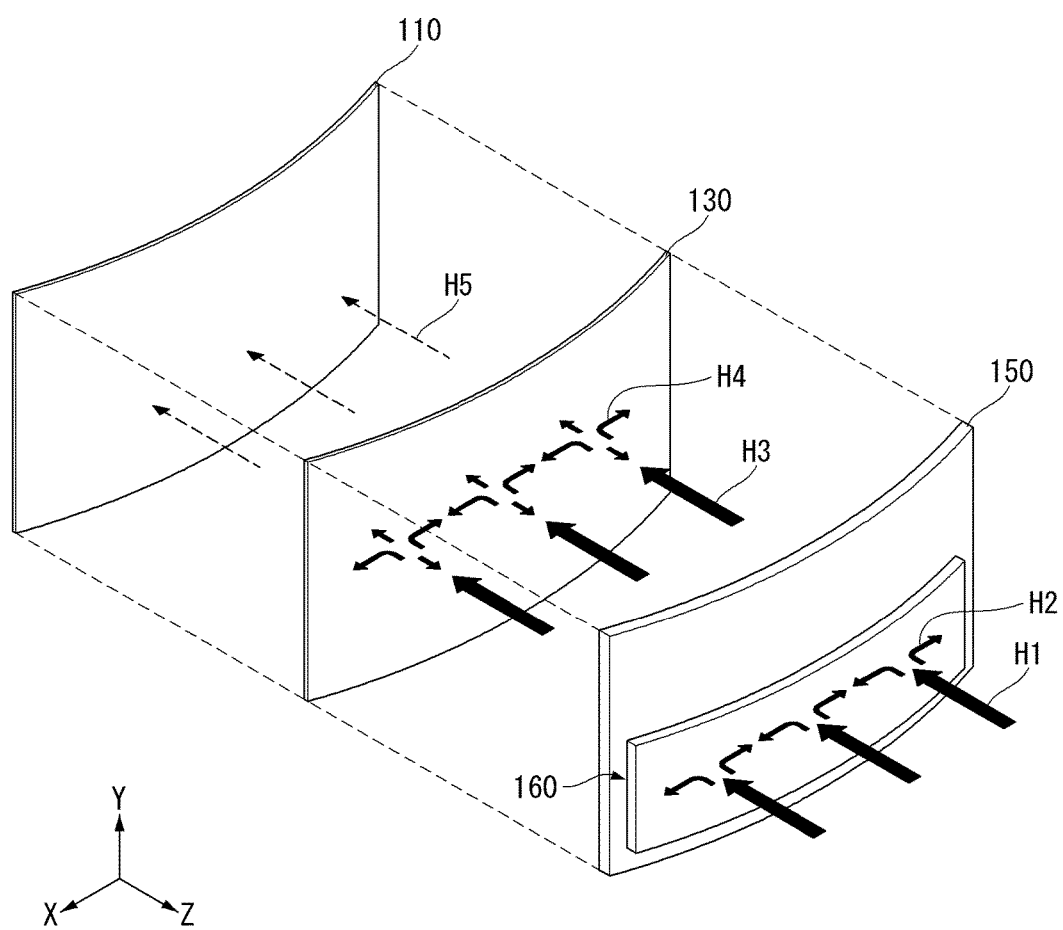

As shown in FIG. 11, the plate 130 may be located between the display panel 110 and the module cover 150. As described previously, a first heat flow H1 may be generated due to electrical equipment located behind the module cover 150. Part of the first heat flow H1 may be distributed along the module cover 150 and generate a second heat flow H2.

Part of the first heat flow H1 may turn into a third heat flow H3, which may be then transferred to the plate 130. The plate 130 may be made of material with high thermal conductivity. For example, it may contain aluminum material. Thus, a substantial portion of the third heat flow H3 transferred to the plate 130 may turn into a fourth heat flow H4 and be distributed. Since the first heat flow H1 generated from the electrical equipment is distributed through the module cover 150 and the plate 130, the fifth heat flow H5 transferred to the display panel 110 may be smaller in amount than the first heat flow H1. Accordingly, this may prevent the heat from the electrical equipment from being concentrated in a particular area of the display panel 110 and minimize the resulting deterioration of the display panel 110.

As shown in FIG. 12, the plate 130 according to an embodiment of the present invention may consist of a plurality of layers. The plate 130 consisting of a plurality of layers allows for effective thermal distribution and blocking. As shown in (a) of FIG. 12, the plate 130 may consist of a first layer 131 and a second layer 133. The first layer 131 may be plastic resin material, and the second layer 133 may be metal material. The second layer 133 may be a layer that comes into contact with the module cover 150. Accordingly, the second layer 133 of metal material may come into contact with at least part of the module cover 150 and distribute heat, and the first layer 131 of plastic resin material may block heat transfer towards the display panel 110.

As shown in (b) of FIG. 12, the plate 130 may consist of a first layer 131, a second layer 133, and a third layer 135. The first and third layers 131 and 135 may be metal material, and the second layer 133 may be plastic resin material. The third layer 135 may be a layer that comes into contact with the module cover 150. Accordingly, the third layer 135 of metal material may come into contact with at least part of the module cover 150 and distribute heat first, and the second layer 133 may block heat transfer and secondarily distribute the heat that has passed through the second layer 133. With this layer configuration, the thickness of each layer may be made relatively thin. That is, it is expected that, if each layer is made thin, it enables to distribute and block heat multiple times and therefore can bring an equal or greater effect.

Figure 13:
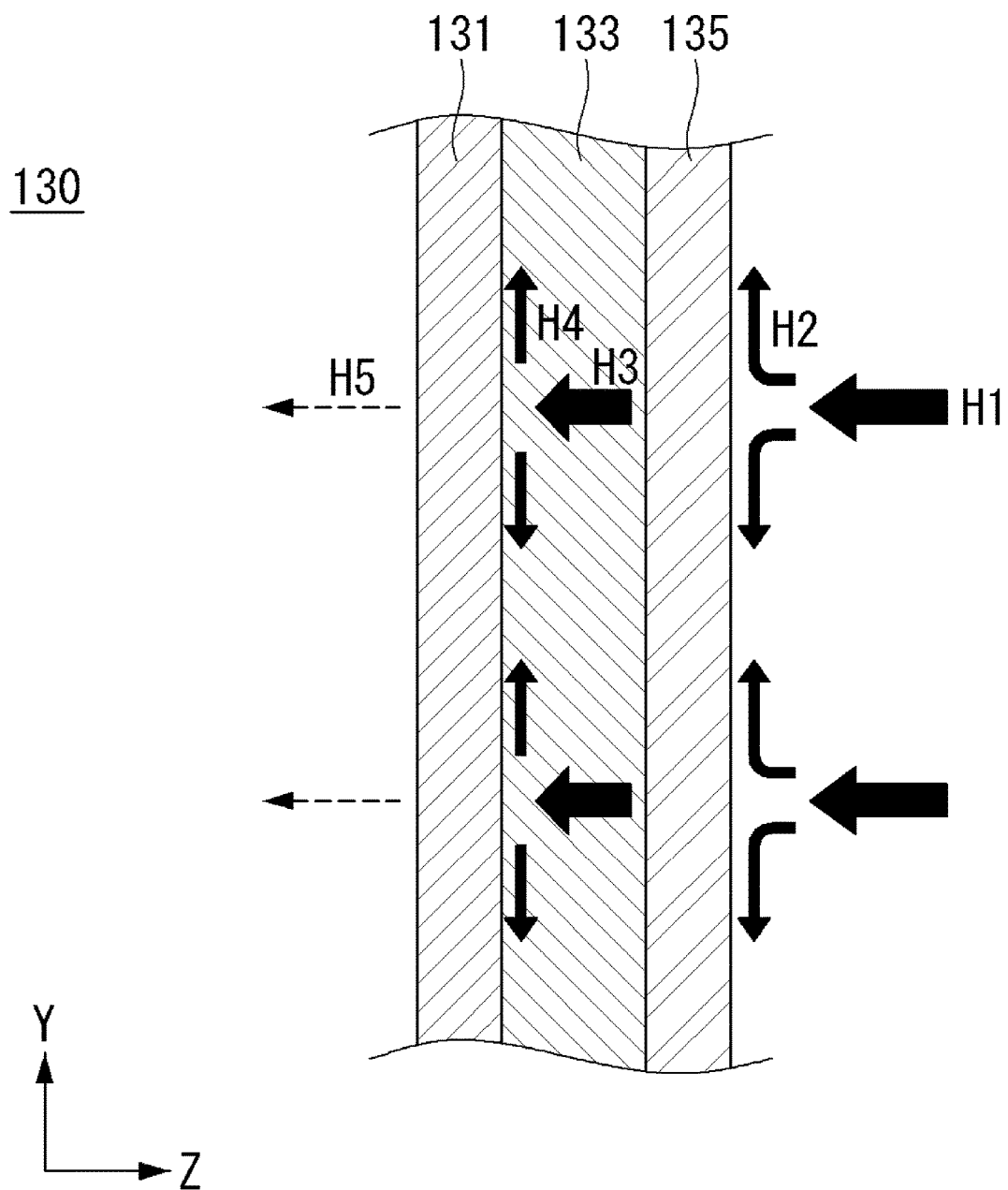

As shown in FIG. 13, part of the first heat flow H1 may turn into the second heat flow H2 at the third layer 135 and be distributed. The third heat flow H3, part of the first heat flow H2 that has passed through the third layer 135, may be blocked by the second layer 133. That is, this means that the second layer 133 of resin material may block the heat that has passed through the third layer 135. The heat that has passed through the second layer 133 may be distributed by the first layer 131. That is, this means that a fourth heat flow H4 may be generated and distributed along the first layer 131 of thermal conductive material. Thus, a fifth heat flow H5 that has passed through the plate 130 may be extremely small in amount than the first heat flow H1. Moreover, heat concentration in a particular area may be eliminated by the thermal distribution.

As shown in FIG. 14, the plate 140 may be connected to the display panel 110 and/or the module cover 150. The connection between the plate 130 and/or the module cover 150 may be done by an adhesive material.

As shown in (a) of FIG. 14, adhesive tape 137 may be attached to one side of the plate 130. Both sides of the adhesive tape 137 may be coated with an adhesive material. One side of the adhesive tape 137 may adhere to the plate 130, and the other side may adhere to the module cover 150. The adhesive tape 137 may comprise first, second, and third strips of adhesive tape 137a to 137c. The first, second, and third strips of adhesive tape 137a to 137c may be attached in a horizontal direction. The first, second, and third strips of adhesive tape 137a to 137c may be attached in a way that keeps them away from the forming area 160. That is, this means that the adhesive tape 137 may not be disposed in the corresponding area since the module cover 150 and the plate 130 are spaced apart from each other in the forming area 160.

As shown in (b) of FIG. 14, the adhesive tape 137 may be attached to the other side of the plate 130. The adhesive tape 137 on the other side may comprise fourth, fifth, and sixth strips of adhesive tape 137d to 137f. The fourth, fifth, and sixth strips of adhesive tape 137d to 137f may be attached in a horizontal direction. The adhesive tape 137, when positioned in the horizontal direction, may prevent screen distortion on the display panel 110. That is, this means that, if the plate 130 and the display panel 110 are connected together by the adhesive tape 137 attached in the horizontal direction, distortions of image output on the display panel 110 can be minimized.

As shown in (a) of FIG. 15, the adhesive tape 137 may not be present in an exclusion area 160a corresponding to the forming area 160. That is, as described above, the adhesive tape 137 may be attached to areas other than the area where the plate 130 and the module cover 150 are in direct contact with each other.

As shown in (b) and (c) of FIG. 15, the adhesive tape 137 may be attached in a vertical direction and/or diagonal direction. That is, this means that the adhesive tape 137 may be positioned in various directions, for effective connection between the plate 130 and the module cover 150 and/or between the plate 130 and the display panel 110.

Figure 16:
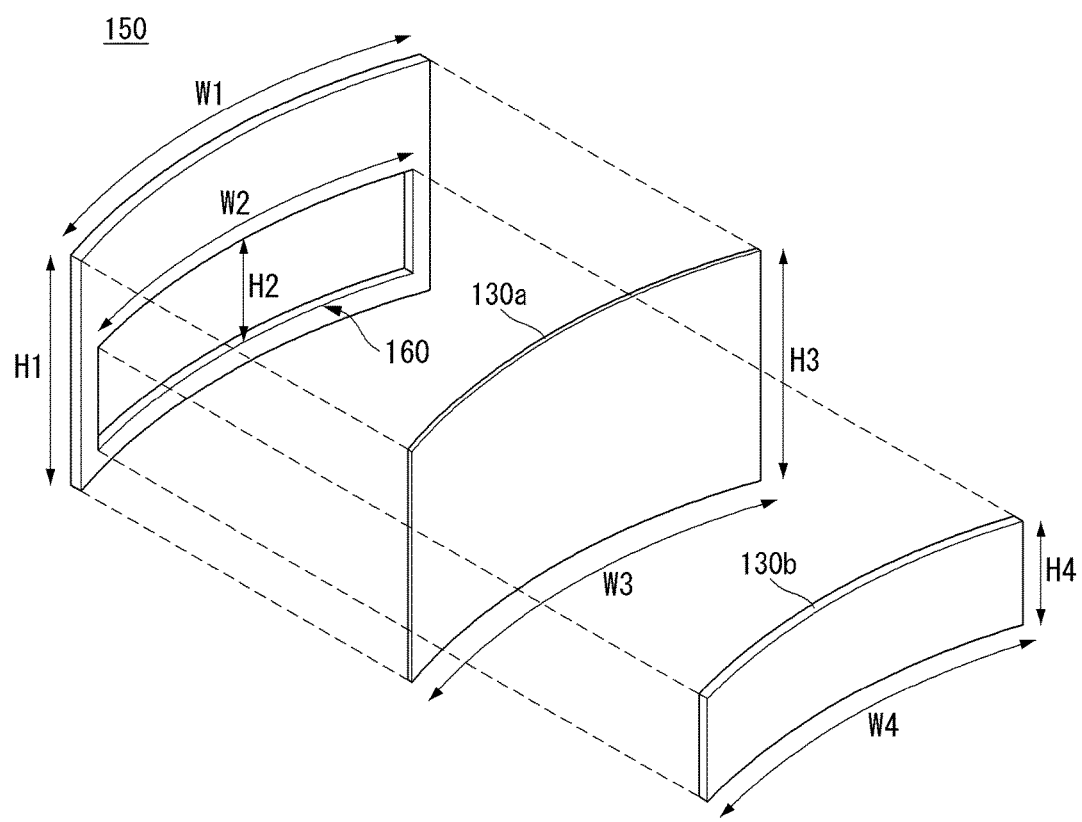

As shown in FIG. 16, the size of the plate may be determined by various factors. Assuming that there is a first plate 130a, for example, the width W3 and height H3 of the first plate 130a may substantially correspond to the width W1 and H1 of the module cover 150. That is, this means that the overall size of the first plate 130a may be equal or slightly smaller than that of the module cover 150. The size of the plate may correspond to the forming area 160. For example, assuming that the width and height of the forming area 160 are W2 and H2, a second plate 130b whose width and height are W4 and H4 may be present. That is, this means that a plate that only covers the forming area 160 where heat is generated, rather than corresponding to the entire module cover 150, may be used. The plate may be conductive material. This means that aluminum materials, graphite materials, and/or mixtures of them may be used.

Figure 17:
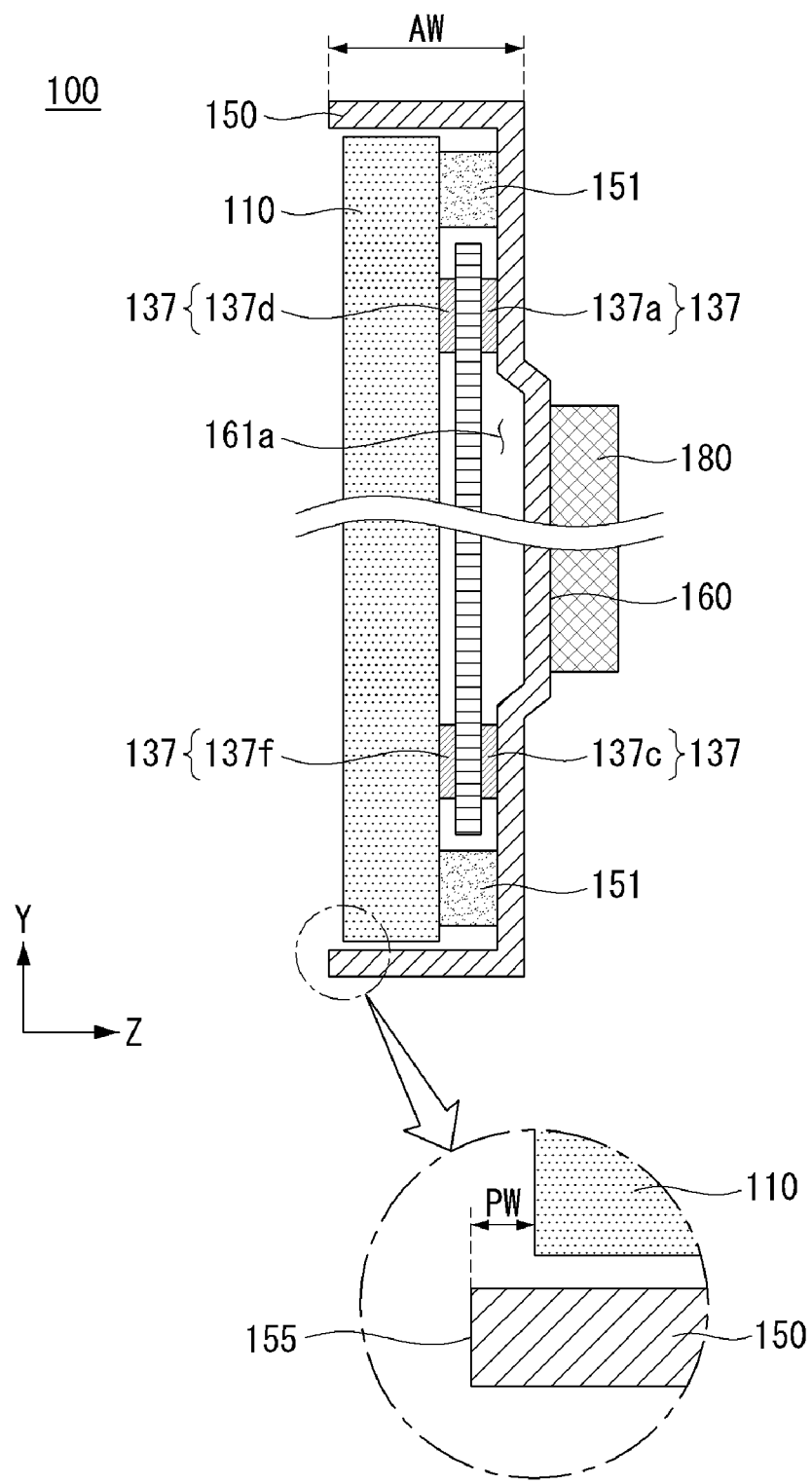
FIGS. 17 and 18 are views related to the module cover of the display device of FIG. 1.
Figure 18:
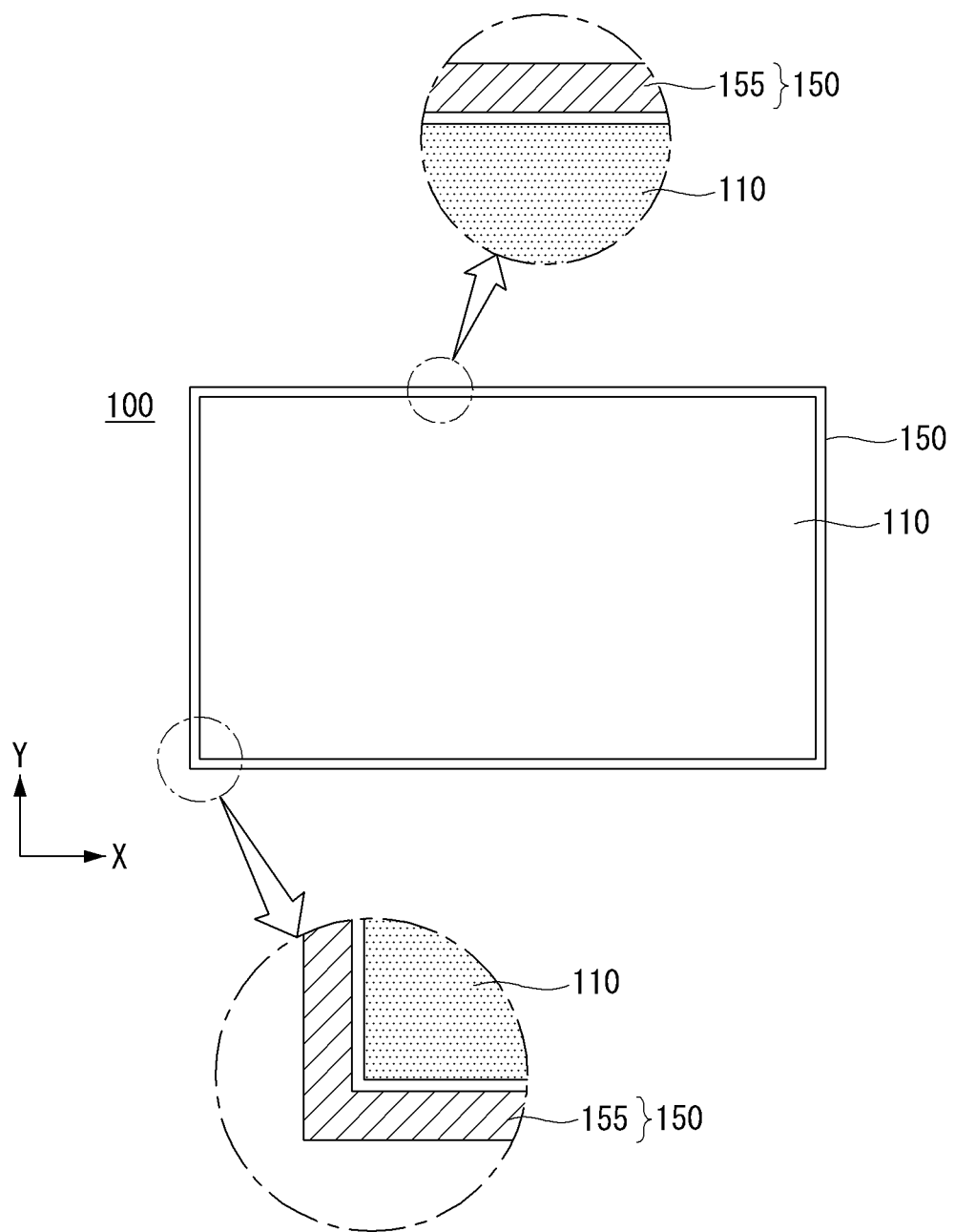

FIGS. 17 and 18 are views related to the module cover of the display device of FIG. 1. As shown in these figures, the module cover 150 of the display device 100 according to an embodiment of the present invention may serve as the bezel of the display device 100. Thus, the elements for bezel configuration may be omitted, thereby reducing the thickness and size of the display device 100.

The module cover 150 may be directly connected to the display panel 110. For example, this means that, if the area of the plate 130 is slightly smaller than the internal area of the module cover 150, a connector 151 may be disposed on its outer perimeter.

The connector 151 may be a means for connecting the module cover 150 and the display panel 110. For example, the connector 151 may be double-sided tape. The connector 151 may hold the module cover 150 and the display panel 110 together with adhesive material. Thus, the conventional elements, such as the middle cabinet, for connecting the module cover 150 and the display panel 110 together may be omitted.

The module cover 150 may include a side surface portion that extends forward from the side surface of the display panel 110. The extended side surface portion may have a processed surface 155. The processed surface 155 may serve as the bezel of the display device 100. That is, this means that, even if the conventional middle cabinet serving as the bezel is omitted, the processed surface 155 of the module cover 150 itself may serve as the bezel. The tip end of the processed surface 155 may protrude than the surface of the display panel 110. That is, this means that the processed surface 155 may jut forward from the display panel 110 by a protrusion distance PW. The protruding processed surface 155 may prevent direct application of external force to the display panel 110. That is, this means that the processed surface 155 may serves as a protective area for the display panel 110.

As shown in FIG. 18, when the display device 100 is viewed from the front, the user may observe the display panel 110 and the processed surface 155. That is, this means that the processed surface 155 may form a rectangular shape along the four corners of the display panel 110. This exposes only the display panel 110 and the processed surface 155 on the front, giving a distinctive look to the design.

The processed surface 155 may be configured to expose the material of the module cover 150. For example, if the module cover 150 is made of aluminum material, the processed surface 155 may have a stripe pattern that reveals the unique color of aluminum. This may be highly appealing to the user's aesthetic sensibilities. Moreover, as described above, its structure protruding forward from the display panel 110 may protect the display panel 110.

Figure 20:
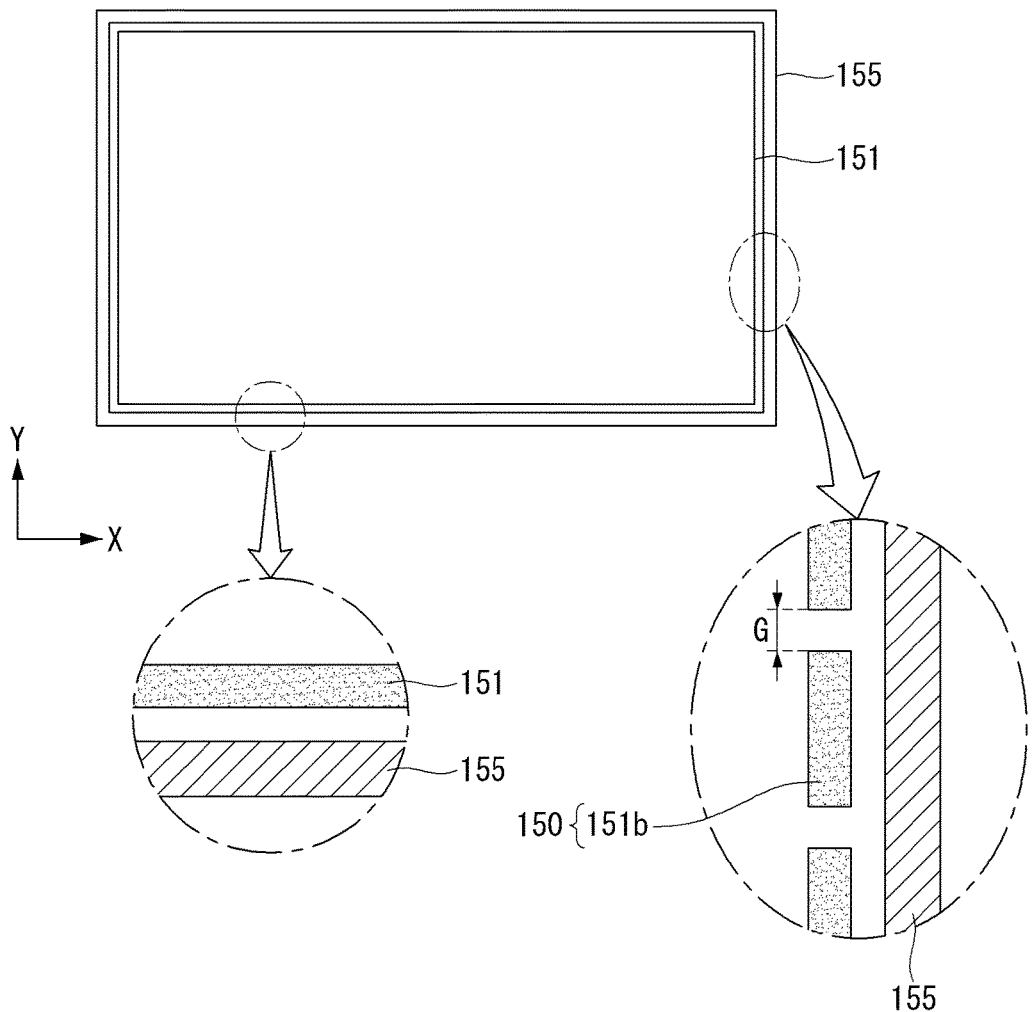

FIGS. 19 and 20 are views related to the module cover of the display device of FIG. 1. As shown in these figures, a connector 151 may be attached to the module cover 150 of the display device 100 according to an embodiment of the present invention.

As shown in FIG. 19, the module cover 150 may have a connector 151. The connector 151 may be double-sided tape. The connector 151 may be disposed on the outer perimeter of the inside surface of the module cover 150. For example, this means that it may be disposed on the inside near the processed surface 155. The connector 151 may be disposed at the four corners, along the outer perimeter of the inside surface of the module cover 150. That is, this means that it may be disposed continuously along the four corners of the module cover 150.

As shown in FIG. 20, the connector 151 may be configured in various shapes. For example, it may be in the shape of a continuous strip, like a first connector 151a. Alternatively, it may be in the shape of repeated units with certain gaps G between them, like a second connector 151b. One or both of the two shapes may be used for the first and second connectors 151a and 151b.

It will be understood that the technical configuration of the invention described above may be embodied in specific forms by those skilled in the art of the present invention without changing the technical idea or essential features of the present invention.

Therefore, it should be understood that the embodiments described above are illustrative and not restrictive in all aspects, and the scope of the present invention is defined by the claims described below, rather than the above detailed description, and the meaning and scope of the claims and all changes and modifications derived from equivalents thereof should be interpreted as being included in the scope of the present invention.

The invention claimed is:

1. A display device comprising:
a display panel having a curved shape;
a plate having a shape curved along the display panel and attached to a rear surface of the display panel;
a module cover including a back portion positioned behind the plate and having a shape curved along the display panel and a side portion extending forward from the back portion and covering a side of the display panel; and
a housing positioned behind the module cover,
wherein the back portion is bent backward to provide a forming area, and a gap is formed between the forming area and the plate.

2. The display device of claim 1, wherein the forming area comprises at least one protruding portion that protrudes towards the housing and does not come into contact with the plate.

3. The display device of claim 2, wherein the protruding portion is divided into a plurality of regions that protrude in at least one of different directions or different distances.

4. The display device of claim 2, wherein a width of the forming area corresponds to a width of the housing.

5. The display device of claim 2, wherein the forming area further comprises a rigidity reinforcement bar that is formed continuously in at least one of horizontal and vertical directions of the module cover.

6. The display device of claim 2, wherein the forming area comprises at least one connecting hole that punctures through the module cover.

7. The display device of claim 6, wherein the display device further comprises fastening members that are fastened to the connecting hole and connect at least one electronic component that drive the display panel to the module cover, wherein at least one of the fastening members differs in length from another one of the fastening members, and wherein the at least one electronic component is spaced apart from the plate.

8. The display device of claim 1, wherein the module cover is made of conductive material.

9. The display device of claim 2, wherein the plate has a size involving an area corresponding to the forming area.

10. The display device of claim 2, wherein the plate further comprises first adhesive tape that is provided on at least one side of the plate and that adheres to at least one of the display panel or the module cover, wherein at least one strip of the first adhesive tape is disposed horizontally with respect to the plate.

11. The display device of claim 10, wherein the first adhesive tape is disposed in areas other than the area corresponding to the forming area.

12. The display device of claim 1, wherein the plate comprises a first layer of conductive material and a second layer of non-conductive material.

13. The display device of claim 1, wherein the plate further comprises a second adhesive tape that connects the display panel and the module cover together.

14. The display device of claim 1, wherein a front end of the side portion is positioned forward of the display panel.

15. The display device of claim 1, wherein the display panel is in the shape of a curved surface that is curved with at least one radius of curvature.

16. The display device of claim 1, wherein the housing contains at least one electronic component that drives the display panel.

17. The display device of claim 1, wherein the back portion and the side portion are formed of one body.

18. The display device of claim 1, wherein the side portion is exposed to an outside.

19. The display device of claim 1, wherein the back portion includes a portion covered by the housing and another portion exposed to an outside.

20. The display device of claim 1, further comprising an electronic component positioned between the forming area and the housing, and
wherein the gap is a first gap and a second gap is formed between the forming area and the electronic component.

* * * * *